United States Patent [19]

Hayakawa

[11] Patent Number: 5,969,556

[45] Date of Patent: Oct. 19, 1999

[54] FLIP-FLOP CIRCUIT, PARALLEL-SERIAL CONVERTING CIRCUIT, AND LATCH CIRCUIT

[75] Inventor: Yasushi Hayakawa, Tokyo, Japan

[73] Assignee: Mitsubishi Denki Kabushiki Kaisha, Tokyo, Japan

[21] Appl. No.: 08/893,190

[22] Filed: Jul. 15, 1997

[30] Foreign Application Priority Data

Mar. 5, 1997 [JP] Japan ..................................... 9-050313

[51] Int. Cl.⁶ .......................... H03K 3/356; H03K 3/289
[52] U.S. Cl. ........................................... 327/202; 327/203
[58] Field of Search ..................................... 327/199, 200, 327/201–203, 208–212, 214, 218

[56] References Cited

U.S. PATENT DOCUMENTS 5,001,361  3/1991  Tamamura et al. ..................... 327/202
5,510,734  4/1996  Sone ........................................ 327/203

FOREIGN PATENT DOCUMENTS 63-246023  10/1988  Japan .
1-286511  11/1989  Japan .
2-292910  12/1990  Japan ..................................... 327/203
5-48402   2/1992  Japan ..................................... 327/202
6-260900  9/1994  Japan ..................................... 327/202

*Primary Examiner*—Tuan T. Lam
*Attorney, Agent, or Firm*—Burns, Doane, Swecker & Mathis, LLP

[57] ABSTRACT

It is an object to enlarge the logical amplitude of an output signal of a flip-flop circuit with a suppressed, low power-supply voltage to reduce the possibility of occurrence of malfunction. A signal outputted from a differential amplification portion is converted in an internal level converting circuit and fed back to bases of transistors of a slave latch. With input signals having a high level at 0.5 V, the internal level converting circuit performs conversion to provide output signals having a high level at 0.25 V to prevent a current flowing between a collector and a base of the transistors.

8 Claims, 13 Drawing Sheets

FLIP-FLOP CIRCUIT, PARALLEL-SERIAL CONVERTING CIRCUIT, AND LATCH CIRCUIT

BACKGROUND OF THE INVENTION

1. Field of the Invention

The present invention relates to a latch circuit for temporarily storing data, a flip-flop circuit including a master latch and a slave latch, a shift register circuit, a serial-parallel converting circuit and a parallel-serial converting circuit formed of flip-flop circuits.

2. Description of the Background Art

FIG. 12 is a circuit diagram showing the structure of a conventional flip-flop circuit. In FIG. 12, CR40 is a clock buffer for converting the level of an input clock T, CR41 is a master latch for holding the logic value of an input signal D and outputting a signal D1 corresponding to the held logic value according to a clock T' outputted from the clock buffer CR40, and CR42 is a slave latch for holding the logic value of the signal D1 outputted from the master latch CR41 and outputting a signal D2 corresponding to the held logic value according to the clock outputted from the clock buffer CR40.

For example, suppose that the flip-flop circuit is formed of bipolar transistors with a base-emitter forward voltage VBE of 0.9 V and a first power-supply voltage VCC of 0 V and a second power-supply voltage VEE of −5.2 V are provided to the flip-flop circuit. The input signal D and the clock T swing between −0.9 V and −1.5 V. In this case, for example, the clock buffer CR40 lowers the center voltage level of the amplitude of the clock to output the clock T' swinging between voltage level of the amplitude of the clock to output the clock T' swinging between −1.8 V and −2.4 V. The master latch CR41 receives the input signal D and the clock T' to output the signal D1 having the same amplitude with the same center voltage level as the input signal D. The slave latch CR42 receives the input signal D1 and the clock T' to output the signal D2 having the same amplitude with the same center voltage level as the input signal D.

Next, circuit structures and operations of the parts of the flip-flop circuit shown in FIG. 12 will be described. A first reference voltage VBB1 and a second reference voltage VBB2 applied to the master latch CR41 and the slave latch CR42 are assumed to be −1.3 V and −2.2 V, respectively. The clock buffer CR40 is formed of an NPN bipolar transistor Q14 having a base receiving the clock T, a collector connected to the first power-supply voltage VCC and an emitter for outputting the clock T' having a converted voltage level, and a resistor R11 having one end connected to the emitter of the transistor Q14 and another end provided with the second power-supply voltage VEE. When the clock T swinging between −0.9 V and −1.5 V is inputted to the base of the transistor Q14, the clock T' swinging between −1.8 V and −2.4 V is outputted at the emitter of the transistor Q14.

The master latch CR41 is formed of resistors R1–R5 and transistors Q1–Q9. The resistor R1 has one end and another end, to the one end of which the first power-supply voltage VCC is applied. The NPN bipolar transistor Q1 has an emitter, a base provided with the input signal D, and a collector connected to another end of the resistor R1. The resistor R2 has one end and another end, to the one end of which the first power-supply voltage VCC is applied. The NPN bipolar transistor Q2 has a collector connected to another end of the resistor R2, a base provided with the first reference voltage VBB1, and an emitter connected to the emitter of the transistor Q1. The NPN bipolar transistor Q3 has an emitter, a collector connected to the emitter of the transistor Q1, and a base provided with the second reference voltage VBB2.

The NPN bipolar transistor Q4 has a base, an emitter, and a collector, the collector of which is connected to another end of the resistor R1. The NPN bipolar transistor Q5 has a base, a collector connected to another end of the resistor R2, and an emitter connected to the emitter of the transistor Q4. The NPN bipolar transistor Q6 has a collector connected to the emitters of the transistors Q4, Q5, a base connected to the emitter of the transistor Q14, and an emitter connected to the emitter of the transistor Q3. A constant-current source I1 has one end connected to the emitters of the transistors Q3 and Q6 and another end supplied with the second power-supply voltage VEE, which outputs a certain current. The NPN bipolar transistor Q8 has a base connected to another end of the resistor R1, a collector to which the first power-supply voltage VCC is applied, and an emitter connected to the base of the transistor Q5. The NPN bipolar transistor Q9 has its collector connected to the first power-supply voltage VCC, its base connected to another end of the resistor R2, and its emitter connected to the base of the transistor Q4. The resistors R4 and R5 each has one end connected to the emitter of the transistor Q8 or Q9 and another end provided with the second power-supply voltage VEE.

The constant-current source I1 is formed of the NPN bipolar transistor Q7 having an emitter, a collector corresponding to the one end of the constant-current source I1, and a base supplied with a voltage VCS always having a certain potential difference with respect to the second power-supply voltage VEE, and the resistor R3 having one end connected to the emitter of the transistor Q7 and another end corresponding to another end of the constant-current source I1.

It is set so that a signal swinging between 0 V and −0.6 V is generated at the collector of the transistor Q1 when the input signal D inputted to the base of the transistor Q1 swings between −0.9 V and −1.5 V, for example. That is to say, if the voltage at the base of the transistor Q1 goes −0.9 V when the transistor Q3 is in an on state, the transistor Q1 turns on and the voltage at another end of the resistor R1 goes −0.6 V. When the voltage at the base of the transistor Q1 goes −1.5 V, the transistor Q1 turns off and another end of the resistor R1 goes 0 V. Since the transistor Q1 and the transistor Q2 turn on/off complementarily to each other, 0 V is generated at another end of the resistor R2 when the transistor Q1 is on and −0.6 V is generated when the transistor Q1 turns off.

The signal D1 swinging between −0.9 V and −1.5 V is generated at the emitters of the transistors Q8 and Q9 according to the signals appearing at the collectors of the transistors Q1 and Q2. When the clock outputted from the clock buffer CR40 causes the transistor Q6 to be on, one of the transistors Q4 and Q5 is always on, since they receive the signal D1 at their respective bases. Then the voltage at the emitters of the transistors Q4 and Q5, or the collector of the transistor Q6, is −1.8 V. When the clock outputted from the clock buffer CR40 causes the transistor Q6 to be off, both of the transistors Q4 and Q5 are in non-operating state, with no current flowing therethrough. These transistors Q1–Q6 operate in the non-saturation region.

In the slave latch CR42, the transistors Q1'–Q7', Q10 and Q11 corresponding to the transistors Q1–Q9 in the master latch CR41 are connected in the same way as the corresponding transistors in the master latch CR41.

Furthermore, an output circuit CR43 for outputting output signals Q, QC of the flip-flop circuit is provided in the stage following the slave latch CR42. The output circuit CR43 is formed of transistors Q12, Q13 having emitters, collectors to which the power-supply voltage VCC is applied, and bases respectively connected to the collectors of the transistors Q1' and Q2', and resistors R9 and R10 each having one end connected to the emitter of the transistor Q12 or Q13, and another end to which the power-supply voltage VEE is applied. The transistors Q12 and Q13 are emitter followers.

When provided with the signal D1 swinging between −0.9 and −1.5 V, the slave latch CR42 operates in the same way as the master latch CR41 to output a signal D2 (Q) which swings between −0.9 and −1.5 V from the output circuit CR43.

When the difference between the first and second power-supply voltages VCC and VEE for operation of the flip-flop circuit becomes as low as 3.3 V, for example, the conventional flip-flop circuit constructed as described above can not stably operate, whatever values are set for the first and second reference voltages VBB1, VBB2 and the voltage VCS1. This is due to the fact that the transistors Q8, Q5, Q6, Q7 are connected in series, and the transistors Q9, Q4, Q6, Q7 are connected in series.

Hence, as shown in FIG. 13, the transistors Q8, Q9 are removed from the master latch CR41 of FIG. 12 to form a master latch CR51, and the transistors Q10, Q11 are removed from the slave latch CR42 of FIG. 12 to form a slave latch CR52. Furthermore, in the master latch CR51 and the slave latch CR52, the bases of the transistors Q4 and Q5 are connected respectively to another ends of the resistors R2 and R1, and the bases of the transistors Q4' and Q5' are connected respectively to the resistors R2' and R1', so as to reduce, by one, the number of the transistors connected in series between the power-supply voltages VCC and VEE. This enables it to operate even if the difference between the power-supply voltages VCC and VEE is 3.3 V. The output circuit CR53 provided in the stage following the slave latch CR52 has the constant-current sources I3 and I4 in place of the resistors R9 and R10 in the output circuit CR43 of FIG. 12, but it operates in the same way. The flip-flop circuit of FIG. 13 has an input level converting circuit CR50 for converting the level of the input signal D. The input level converting circuit CR50 is formed of resistors R15, R16 each having one end provided with the power-supply voltage VCC and another end, an NPN bipolar transistor Q16 having an emitter, a base supplied with the input signal D, and a collector connected to another end of the resistor R15, an NPN bipolar transistor Q17 having an emitter connected to the emitter of the transistor Q16, a base to which the reference voltage VBB3 is applied, and a collector connected to another end of the resistor R16, and a constant-current source I2 connected between the emitters of the transistors Q16, Q17 and the power-supply potential point to which the power-supply voltage VEE is applied.

When the flip-flop circuit is structured as shown in FIG. 13, however, it is necessary to set the amplitude center of the input signal D at −0.95 V, convert the center to −0.15 V in the input level converting circuit CR50, and limit the amplitude of the signals handled by the master latch CR51 and the slave latch CR52 between 0 V and −0.3 V, and it is also necessary to set the center of the amplitude of the output signal at −0.95 V, and limit its amplitude between −0.8 V and −1.1 V.

Since the amplitude of the output signal of the flip-flop circuit is limited to 0.3 V, the signal outputted from the flip-flop circuit is susceptible to noise and signal attenuation while traveling on the interconnection. Integrated circuits using this flip-flop circuit will therefore be prone to malfunction. The amplitude is thus limited because the transistors connected in series, such as the transistors Q1 and Q3, Q2 and Q3, Q4 and Q6, and Q5 and Q6, exist in the course of the current path of the constant-current source I1 in the master latch CR41, for example.

When the difference between the power-supply voltages is made smaller, the suitable voltage level at the input terminals of the master latch CR41 and the slave latch CR42, or at the base of the transistor Q1, and the center of the logical amplitude of the input signal D do not meet. Hence, when the amplitudes and the levels of the amplitude centers of the input signal and the output signal are standardized as in an integrated circuit using a gate array, e.g., when the input/output signals must swing between −1.05 V and −1.55 V and it is difficult to change, it will be difficult to apply a flip-flop circuit using the series-gate ECL.

The above-described problem also applies to a latch circuit.

With a shift register circuit, a serial-parallel converting circuit and a parallel-serial converting circuit using the above-described flip-flop circuit, the problem is more serious because they have a larger number of flip-flop circuits.

SUMMARY OF THE INVENTION

According to a first aspect of the present invention, a flip-flop circuit comprises: a master latch having first and second output terminals for outputting held data as a potential difference between the first and second output terminals, for holding, as data, a value of an input signal at the time when a clock goes to a first level while the clock remains at a first level; and a slave latch for holding output data of the master latch when the clock goes to a second level; wherein the slave latch comprises differential amplification means having first and second output terminals for differential-amplifying a potential difference between the first and second output terminals of the master latch to output an output signal, level converting means connected to the first and second output terminals of the differential amplification means, for performing such level conversion as to shift one level of an amplitude of the output signal of the differential amplification means toward another level and outputting an output signal from first and second level converting terminals, a first transistor having one current electrode, another current electrode connected to the first output terminal of the differential amplification means, and a control electrode connected to the first output terminal of the level converting means, a second transistor having one current electrode connected to the one current electrode of the first transistor, another current electrode connected to the second output terminal of the differential amplification means, and a control electrode connected to the second output terminal of the level converting means, a third transistor for controlling a power-supply current to be supplied to the differential amplification means according to the clock provided to a control electrode, one current electrode, and another current electrode, a fourth transistor having one current electrode connected to the one current electrode of the third transistor, the another current electrode connected to the one current electrode of the first transistor and to the one current electrode of the second transistor, and a control electrode supplied with an inverse clock of the clock provided to the control electrode of the third transistor, and a first constant-current source for making constant current flow out through the one current electrode of the third transistor and the one current electrode of the fourth transistor.

Preferably, according to a second aspect of the present invention, the flip-flop circuit outputs a voltage of not less than 0.4 V between the first and second output terminals of the differential amplification means when a voltage larger than twice and smaller than 4.5 times the forward voltage between a control electrode and one current electrode of each of the first to fourth transistors is applied as a power-supply voltage between the differential amplification means and the first constant-current source.

According to a third aspect of the present invention, in a parallel-serial converting circuit formed by using a plurality of flip-flop circuits in a semiconductor integrated circuit, each of the plurality of flip-flop circuits comprises a master latch having first and second output terminals for outputting held data as a potential difference between the first and second output terminals, for holding, as data, a value of an input signal at the time when a clock goes to a first level while the clock remains at a first level; and a slave latch for holding output data of the master latch when the clock goes to a second level; wherein the slave latch comprises differential amplification means having first and second output terminals for differential-amplifying a potential difference between the first and second output terminals of the master latch to output an output signal, level converting means connected to the first and second output terminals of the differential amplification means, for performing such level conversion as to shift one level of the amplitude of the output signal of the differential amplification means toward another level to output an output signal from first and second level converting terminals, a first transistor having one current electrode, another current electrode connected to the first output terminal of the differential amplification means, and a control electrode connected to the first output terminal of the level converting means, a second transistor having one current electrode connected to the one current electrode of the first transistor, another current electrode connected to the second output terminal of the differential amplification means, and a control electrode connected to the second output terminal of the level converting means, a third transistor having one current electrode, another current electrode connected to the differential amplification means, and a control electrode supplied with the clock, for controlling a power-supply current to be supplied to the differential amplification means according to the clock, a fourth transistor having one current electrode connected to the one current electrode of the third transistor, another current electrode connected to the one current electrode of the first transistor and to the one current electrode of the second transistor, and a control electrode supplied with an inverse clock of the clock provided to the control electrode of the third transistor, and a first constant-current source for making constant current flow out through the one current electrode of the third transistor and the one current electrode of the fourth transistor.

According to a fourth aspect of the present invention, a latch circuit comprises: differential amplification means for differential-amplifying a potential difference between first and second signals to output an output signal from first and second output terminals; level converting means connected to the first and second output terminals of the differential amplification means, for reducing an amplitude of the output signal of the differential amplification means to output an output signal from first and second level converting terminals; a first transistor having one current electrode, another current electrode connected to the first output terminal of the differential amplification means, and a control electrode connected to the first output terminal of the level converting means, a second transistor having one current electrode connected to the one current electrode of the first transistor, another current electrode connected to the second output terminal of the differential amplification means, and a control electrode connected to the second output terminal of the level converting means, a third transistor for controlling a power-supply current to be supplied to the differential amplification means according to the clock provided to a control electrode, a fourth transistor having one current electrode connected to the one current electrode of the third transistor, another current electrode connected to the one current electrode of the first transistor and to the one current electrode of the second transistor, and a control electrode supplied with an inverse clock of the clock provided to the control electrode of the third transistor, and a first constant-current source for making constant current flow out through the one current electrode of the third transistor and the one current electrode of the fourth transistor.

Preferably, according to a fifth aspect, the latch circuit outputs a voltage of not less than 0.4 V between the first and second output terminals of the differential amplification means when a voltage larger than twice and smaller than 4.5 times the forward voltage between a control electrode and the one current electrode of each of the first to fourth transistors is applied as a power-supply voltage between the differential amplification means and the first constant-current source.

According to the flip-fop circuit of the first aspect of the present invention or the latch circuit of the sixth aspect, in such a case that the first and second transistors turn on in the opposite voltage to the polarity of the power-supply voltage when the voltage between the first and second output terminals of the differential amplification means is applied between the one current electrode and the control electrode of each of the first and second transistors, the level converting circuit can shift one of the levels of the signal applied to the control electrode of each of the first and second transistors toward another level. This prevents the first and second transistors from reversely turning on, providing the effect of improving the operating speed and preventing malfunction of the flip-flop circuit or the latch circuit.

According to the flip-flop circuit of the second aspect or the latch circuit of the seventh aspect, it is possible to obtain an output signal with a large logical amplitude of about 0.5 V, for example, even if the power-supply voltage is as low as about 3.3 V, for example. This provides the effect of improving the reliability against noise such as strokes while preventing reduction of the operating speed and malfunction.

According to the shift register of the third aspect, the serial-parallel converting circuit of the fourth aspect, or the parallel-serial converting circuit of the fifth aspect, the use of a plurality of the flip-flop circuit of the first or second aspect relaxes restrictions in designing the interconnection lengths and the like, facilitating placement and routing. This also facilitates the auto placement and routing.

The present invention has been made to solve the problems described above. An object of the present invention is to reduce the possibility of being affected by noise and signal attenuation in transmission on the interconnection. Another object is to obtain a flip-flop circuit which operates at a low power-supply voltage not less than twice and not more than 4.5 times the base-emitter junction forward voltage of a bipolar transistor and which can, even when input and output signals are standardized, output corresponding input/output signals. Still another object is to enable the application of a flip-flop circuit to an integrated circuit using standardized input/output signals, such as a gate array, and obtain the flip-flop circuit easy to design and less liable to malfunction of the integrated circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
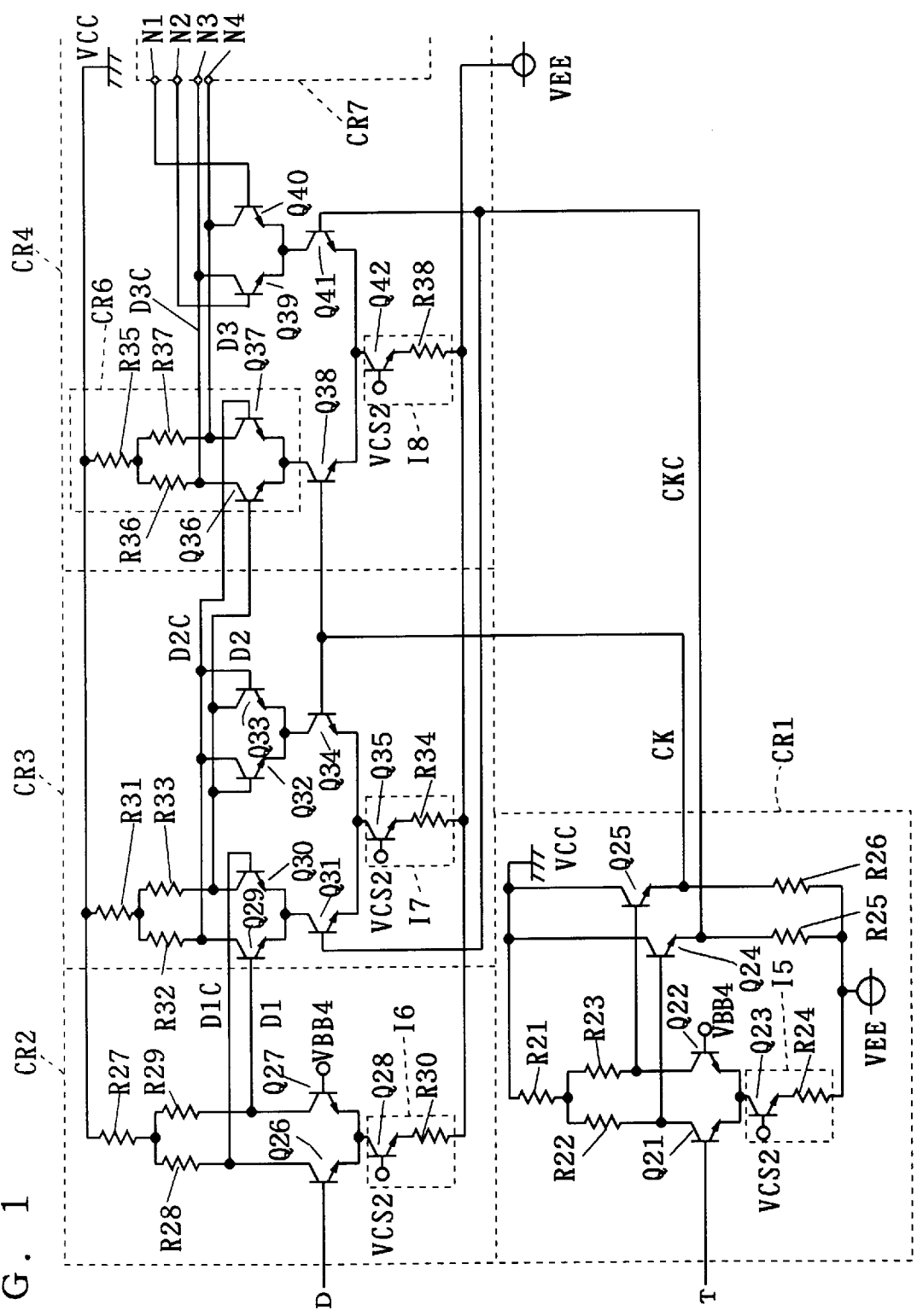
FIG. 1 is a circuit diagram showing a preceding stage of a structure of a flip-flop circuit according to a first preferred embodiment of the present invention.

Now, a flip-flop circuit according to a first preferred embodiment of the present invention will be described referring to FIG. 1. FIG. 1 is a circuit diagram showing the structure of a flip-flop circuit according to a first preferred embodiment of the present invention. The flip-flop circuit shown in FIG. 1 is formed of a master latch and a slave latch.

The flip-flop circuit of FIG. 1 is supplied with a clock T and an input signal D from outside, which makes internal transitions depending on the value of the input signal D provided at the timing of the clock T. In other words, it holds the value of the input signal D as data when the clock T changes from a low level to a high level and continues outputting the held data until the clock T changes from the low level to the high level next.

The flip-flop circuit of FIG. 1 realizes this function with the two latch circuits, the master latch and the slave latch. The latch circuits in FIG. 1 hold data at the time when the clock makes a transition from a low level to a high level while the clock is at the high level.

The flip-flop circuit of FIG. 1 is formed of a clock buffer CR1 performing buffering of converting the level of the clock T and outputting internal clocks CK and CKC, an input level converting circuit CR2 converting the level of the input signal D to output internal signals D1 and D1C, a master latch CR3 holding the signals D1 and D1C according to the internal clocks CK, CKC and outputting signals D2, D2C according to the held logic values, a slave latch CR4 holding the signals D2, D2C according to the internal clocks CK, CKC and outputting signals D3, D3C according to the held logic values, and an output circuit CR5. The internal clock CKC is an inverse of the internal clock CK.

The clock buffer CR1 is composed of NPN bipolar transistors Q21–Q25 and resistors R21–R26. The transistor Q21 has an emitter, a base supplied with the clock T from the outside, and a collector connected to another end of the resistor R22. When the clock T swings between $-0.85$ V and $-1.35$ V, for example, the transistor Q21 outputs a signal swinging between $-0.30$ V and $-0.55$ V at its collector. The transistor Q22 has a base supplied with a reference voltage VBB4, an emitter connected to the emitter of the transistor Q21, and a collector connected to another end of the resistor R23. When the clock T swings between $-0.85$ V and $-1.35$ V and the reference voltage VBB4 is $-1.1$ V, for example, the transistor Q22 outputs a signal swinging between $-0.30$ V and $-0.55$ V at its collector.

The resistors R22 and R23 each has its one end connected to another end of the resistor R21. A power-supply voltage VCC is applied to one end of the resistor R21. A constant-current source I5 is connected to the emitters of the transistors Q21 and Q22. The constant-current source I5 keeps the current flowing from the transistors Q21 and Q22 constant. This constant-current source I5 is formed of the transistor Q23 having an emitter, a base supplied with a reference voltage VCS2 and a collector connected to the emitters of the transistors Q21 and Q22, and the resistor R24 having one end connected to the emitter of the transistor Q23 and another end supplied with a power-supply voltage VEE.

The transistor Q24 has an emitter to which the power-supply voltage VEE is applied through the resistor R25, a collector to which the power-supply voltage VCC is applied, and a base connected to the collector of the transistor Q21. The transistor Q24 outputs the internal clock CKC from its emitter.

The transistor Q25 has an emitter to which the power-supply voltage VEE is applied through the resistor R26, a collector to which the power-supply voltage VCC is applied, and a base connected to the collector of the transistor Q22. The transistor Q25 outputs the internal clock CK from its emitter. The internal clock CKC is obtained by inverting the clock T. The internal clock CK is in a complementary relation with respect to the internal clock CKC.

The input level converting circuit CR2 is formed of NPN bipolar transistors Q26–Q28 and resistors R27–R30. The transistor Q26 has an emitter, a base supplied with the input signal and a collector connected to another end of the resistor R28. When the input signal D swings between $-0.85$ V and $-1.35$ V, for example, it outputs the signal D1C swinging between −0.25 V and −0.55 V. The transistor Q27 has an emitter connected to the emitter of the transistor Q26, a collector connected to another end of the resistor R29, and a base to which the reference voltage VBB4 is applied. When the input signal D swings between −0.85 V and −1.35 V and the reference voltage VBB4 is −1.1 V, for example, the transistor Q27 outputs the signal D1 swinging between −0.25 V and −0.55 V.

The constant-current source I6 makes a certain current flow out through the emitters of the transistors Q26 and Q27. The constant-current source I6 is formed of the transistor Q28 having an emitter, a base provided with the reference voltage VCS2, and a collector connected to the emitters of the transistors Q26 and Q27, and the resistor R30 having one end connected to the emitter of the transistor Q28 and another end to which the power-supply voltage VEE is applied.

The master latch CR3 of FIG. 1 is formed of resistors R31–R34 and NPN bipolar transistors Q29–Q35. The master latch CR3 has almost the same structure as the master latch CR51 shown in FIG. 12. They are different in structure in that, while the transistors Q1, Q2 of the master latch CR51 are directly supplied with the power-supply voltage VCC through the resistors R1 and R2, the collectors of the transistors Q29, Q30 of the master latch CR3 are connected to another ends of the resistors R32, R33 and the power-supply voltage VCC is applied through the resistor R31 to one end of the resistor R32 and one end of the resistor R33. In other respects, the connections between the transistors Q1–Q6 and the connections between the transistors Q29–Q34 are the same. As well as the master latch CR51, the master latch CR3 includes a constant-current source I7 between the emitters of the transistors Q31, Q34 and the power-supply potential point provided with the power-supply voltage VEE. This constant-current source I7 is formed of the transistor Q35 having an emitter, a collector connected to the emitters of the transistors Q31, Q34, and a base to which the reference voltage VCS2 is applied, and the resistor R34 having one end connected to the emitter of the transistor Q35 and another end to which the power-supply potential VEE is applied. The signal outputted from the collector of the transistor Q29 of the master latch CR3 is the signal D2C and the signal outputted from the collector of the transistor Q30 is the signal D2.

The slave latch CR4 is formed of NPN transistors Q36–Q47 and resistors R35–R44.

The slave latch CR4 includes a differential amplification portion CR6 for differential-amplifying the input signals D2 and D2C to obtain the output signals D3, D3C. The transistor Q38 is connected in series to the differential amplification portion CR6. This transistor Q38 has an emitter, a collector connected to the differential amplification portion CR6 and a base receiving the internal clock CK. The transistor Q38 controls the power-supply current flowing to the differential amplification portion CR6 according to the internal clock CK. That is to say, when the internal clock CK is at a high level, the transistor Q38 conducts to pass the power-supply current, and the differential amplification portion CR6 then goes into an operating state. When the internal clock CK is at a low level, the transistor Q38 cuts off the current and the differential amplification portion CR6 enters a non-operating state.

Signals having the same logic values as the signals D3 and D3C and converted in level are fed back to the bases of the transistors Q39 and Q40 from output terminals N2 and N1 of an internal level converting circuit CR7. Particularly, in this case, the internal level converting circuit CR7 performs such level conversion as to limit the high level. The collectors of the transistors Q39 and Q40 are connected to the collectors of the transistors Q36 and Q37, respectively. The emitters of the transistors Q39 and Q40 are connected in common. The transistor Q41 has a collector connected to the emitters of the transistors Q39 and Q40, a base supplied with the internal clock CKC, and an emitter connected to the emitter of the transistor Q38. The emitters of the transistors Q38 and Q41 are connected to the constant-current source I8. The constant-current source I8 is formed of the transistor Q42 having an emitter, a base to which the reference voltage VCS2 is applied, and a collector connected to the emitters of the transistors Q38 and Q41, and the resistor R38 having one end connected to the emitter of the transistor Q42 and another end to which the power-supply voltage VEE is applied.

The differential amplification portion CR6 is formed of resistors R35–R37 and NPN bipolar transistors Q36, Q37. The transistors Q36 and Q37 have their respective emitters connected in common to form a differential pair. The base of the transistor Q36 is supplied with the output signal D2 from the master latch CR3 and the base of the transistor Q37 is supplied with the output signal D2C from the master latch CR3. The power-supply voltage VCC is applied to the collector of the transistor Q36 through the resistors R35 and R36 and the output signal D3C of the slave latch CR4 is outputted from the collector of the transistor Q36. Another ends of the resistors R36 and R37 are connected to the collector of the transistors Q36 and Q37. The power-supply voltage VCC is applied to one end of the resistor R36 and one end of the resistor R37 through the resistor R35 and the output signal D3 of the slave latch CR4 is outputted from the collector of the transistor Q37. The transistor Q36 has its collector connected to the input terminal N3 of the internal level converting circuit CR7 and the transistor Q37 has its collector connected to the input terminal N4 of the internal level converting circuit CR7.

The internal level converting circuit CR7 is formed of transistors Q43–Q47 and resistors R39–R44.

The transistor Q43 has an emitter, a collector to which the power-supply voltage VCC is applied, and a base connected to the input terminal N4 to receive the output signal D3 of the differential amplification portion CR6. The emitter of the transistor Q43 swings at a voltage 0.8 V lower than the output signal D3, for example. Similarly, the transistor Q44 has an emitter, a collector to which the power-supply voltage VCC is applied, and a base connected to the input terminal N3 to receive the output signal D3C of the differential amplification portion CR6. The emitter of the transistor Q44 swings at a voltage 0.8 V lower than the output signal D3, for example. One end of the resistor R39 and one end of the resistor R40 are connected to the emitters of the transistors Q43 and Q44, respectively, both of which are supplied with the power-supply voltage VEE at their respective another ends.

The transistors Q45, Q46 have collectors, emitters connected in common, and bases respectively connected to the emitters of the transistors Q43 and Q44. The transistors Q45 and Q46 form a differential pair. The constant-current source I9 connected to the emitters of the transistors Q45 and Q46 makes a certain current flow out through the emitters of the transistors Q45 and Q46. This constant-current source I9 is formed of the transistor Q47 having an emitter, a base to which the reference voltage VCS2 is applied, and a collector connected to the emitters of the transistors Q45 and Q46, and the resistor R44 having one end connected to the emitter of the transistor Q47 and another end to which the power-supply voltage VEE is applied. Another end of the resistor R42 is connected to the collector of the transistor Q45 and the collector of the transistor Q46 is connected to another end of the resistor R43. The power-supply voltage VCC is applied to one end of the resistor R42 and one end of the resistor R43 through the resistor R41. The collectors of the transistors Q45 and Q46 are connected respectively to the bases of the transistors Q40 and Q39 (the output terminals N1 and N2). The signals outputted from the collectors of the transistors Q45 and Q46 under the above-described conditions swing between −0.25 V and −0.5 V.

When the power-supply voltage VCC is 0 V and the power-supply voltage VEE is −3.3 V, and the output signals D2, D2C of the master latch CR3 swing between −0.25 V and −0.5 V, for example, it is possible to set the output signals D3, D3C of the slave latch CR4 to swing between −0.05 V and −0.55 V. This is enabled by setting low the upper limit on the high level side of the voltage of the signals fed back to the bases of the transistors Q39 and Q40 with the internal level converting circuit CR7.

That is to say, suppose that the collector of the transistor Q39 is at −0.55 V and the collector of the transistor Q40 is −0.05 V, for example. If these voltages are intactly fed back to the bases of the transistors Q39 and Q40 in a conventional manner, then the voltage at the collector of the transistor Q39 becomes −0.45 V lower than that at the base. Then a current flows from the base to the collector in the transistor Q39 in an off state, which slows down the operating speed. Hence, the high level of the signals fed back to the bases of the transistors Q39 and Q40 is limited, or the high level is shifted to −0.25 V in this case, for example. This prevents the current flowing from a base to a collector in one of the transistors Q39 and Q40 which is off, which provides high-speed circuit operation. This structure which prevents current flowing from the base to the collector reduces the possibility of malfunction as compared with the case in which a current flows from the base to the collector.

The output signals D3 and D3C of the slave latch CR4 are outputted to the outside through the output circuit CR5. This output circuit CR5 is formed of two NPN bipolar transistors Q48 and Q49 and resistors R45 and R46.

The transistor Q48 has an emitter to which the power-supply voltage VEE is applied through the resistor R45, a collector to which the power-supply voltage VCC is applied, and a base supplied with the output signal D3 of the slave latch CR4. An output signal Y1 of the flip-flop circuit is outputted from the emitter of the transistor Q48. The transistor Q49 has an emitter to which the power-supply voltage VEE is applied through the resistor R46, a collector to which the power-supply voltage VCC is applied, and a base supplied with the output signal D3C of the slave latch CR4. An output signal Y2 of the flip-flop circuit is outputted from the emitter of the transistor Q49.

When the output signals D3, D3C of the slave latch CR4 swing between −0.05 V and −0.55 V, the output signals Y1 and Y2 of the flip-flop circuit outputted from the output circuit CR5 can be set to swing between −0.85 V and −1.35 V, for example. In spite of the fact that the voltage between the power-supply voltage VCC (0 V) and the power-supply voltage VEE (−3.3 V) is as small as 3.3 V, the flip-flop circuit can obtain output signals which swing with 0.5 V without deterioration of the operating speed and the reliability of operation. Accordingly, when a gate is provided following the flip-flop circuit of the first preferred embodiment, or when a plurality of flip-flop circuits are cascade-connected, for example, this eliminates the necessity of making differential connection with the following gate, allowing easy connection between gates. It is possible to have the flip-flop circuit to provide only one output, which reduces the dissipation current.

Figure 12:
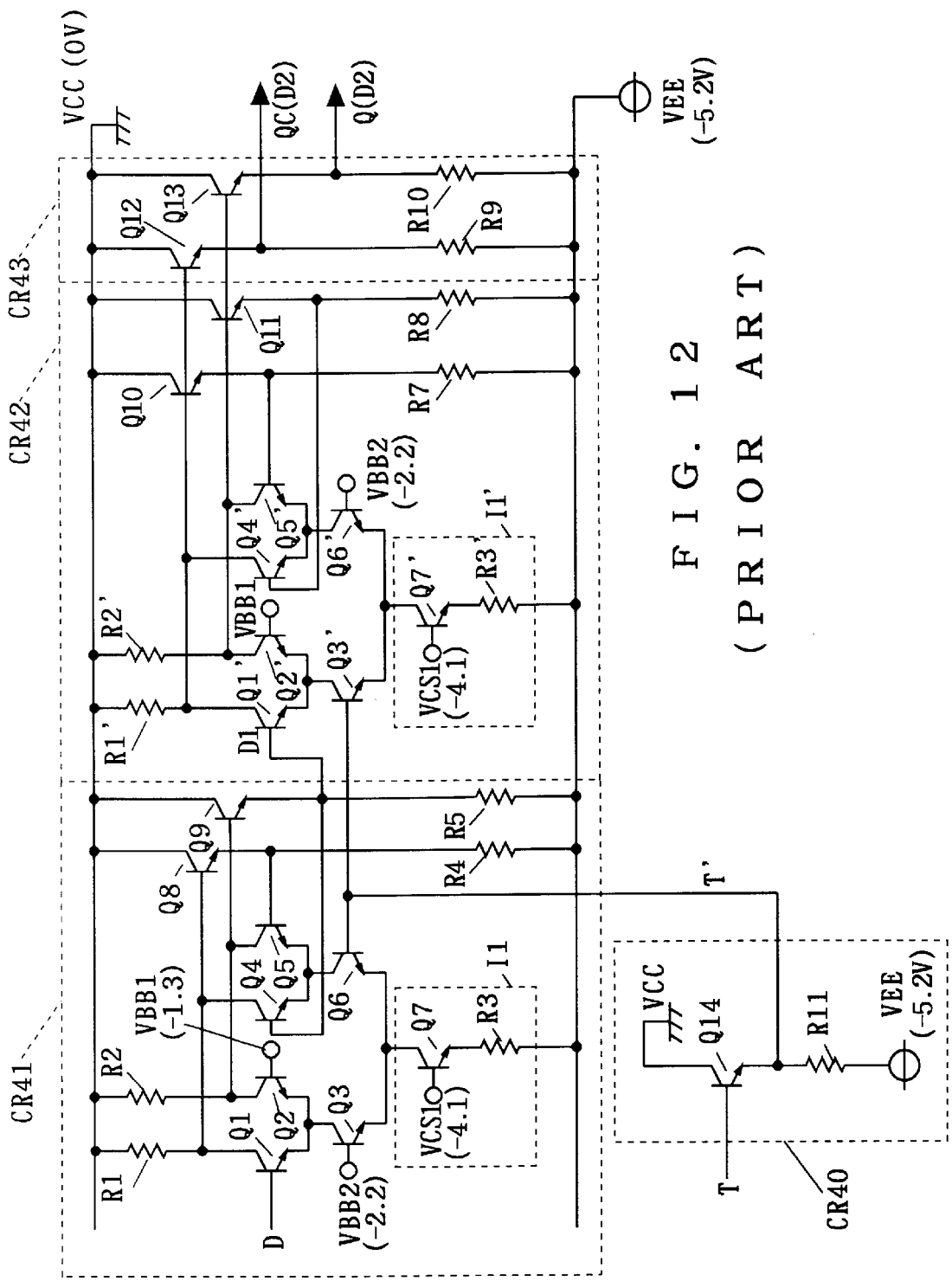
FIG. 12 is a circuit diagram showing the structure of a conventional flip-flop circuit.
Figure 13:
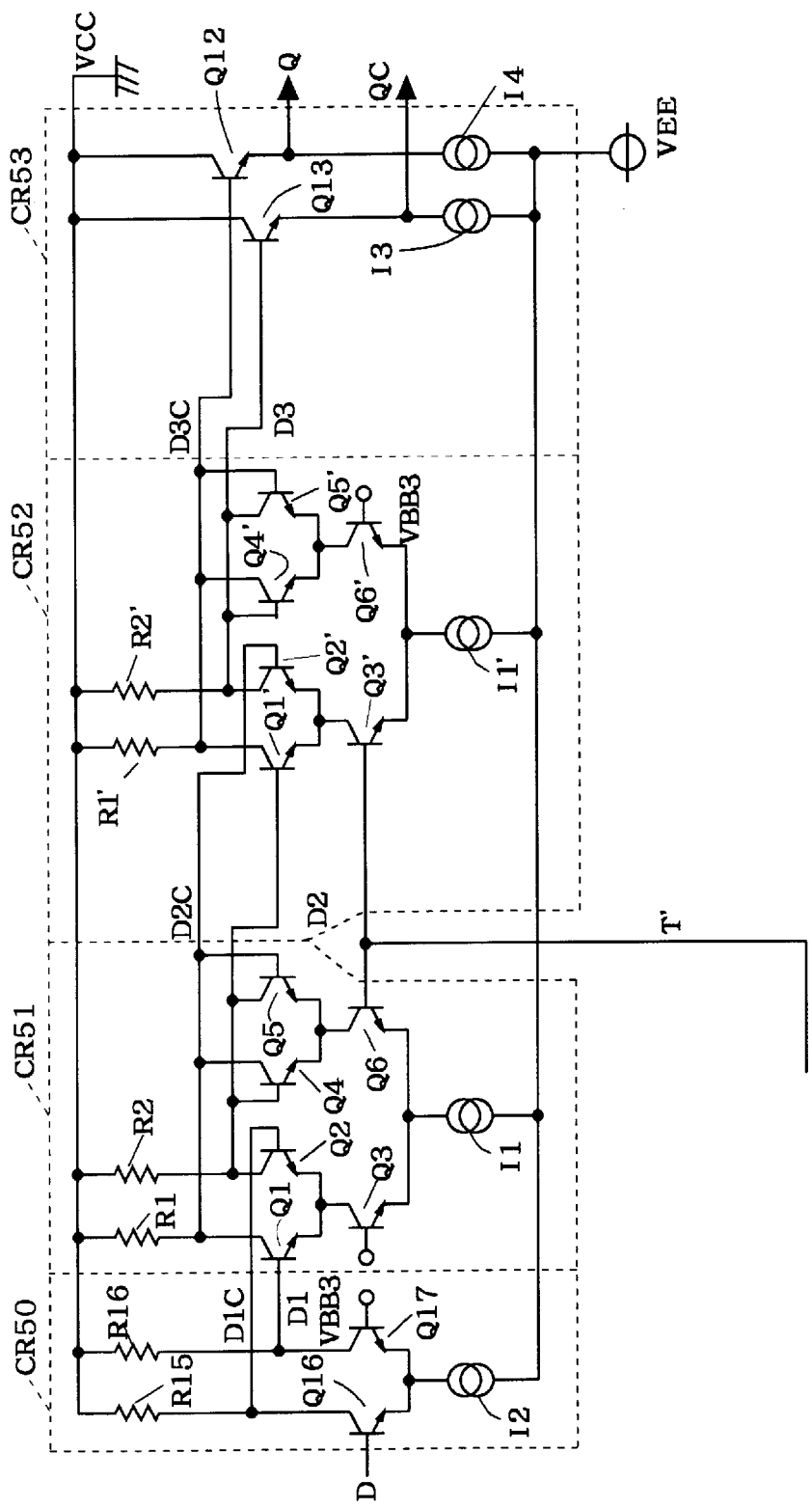
FIG. 13 is a circuit diagram for use in describing a modification in structure applied to the flip-flop circuit for operation with a low power-supply voltage.

Since the outputs of the differential amplification portion CR6 are directly provided to the output circuit CR5, the delay time for obtaining the data output signals Y1 and Y2 from the clock T can be at about the same extent as the conventional flip-flop circuit shown in FIG. 12.

These effects of the invention depend on the number of transistors connected in series in the path of application of the power-supply voltage. Accordingly, the effects are remarkable when the operating voltage of the flip-flop circuit is a low power-supply voltage not less than twice and not more than 4.5 times the base-emitter junction forward voltage of the bipolar transistor.

Figure 2:
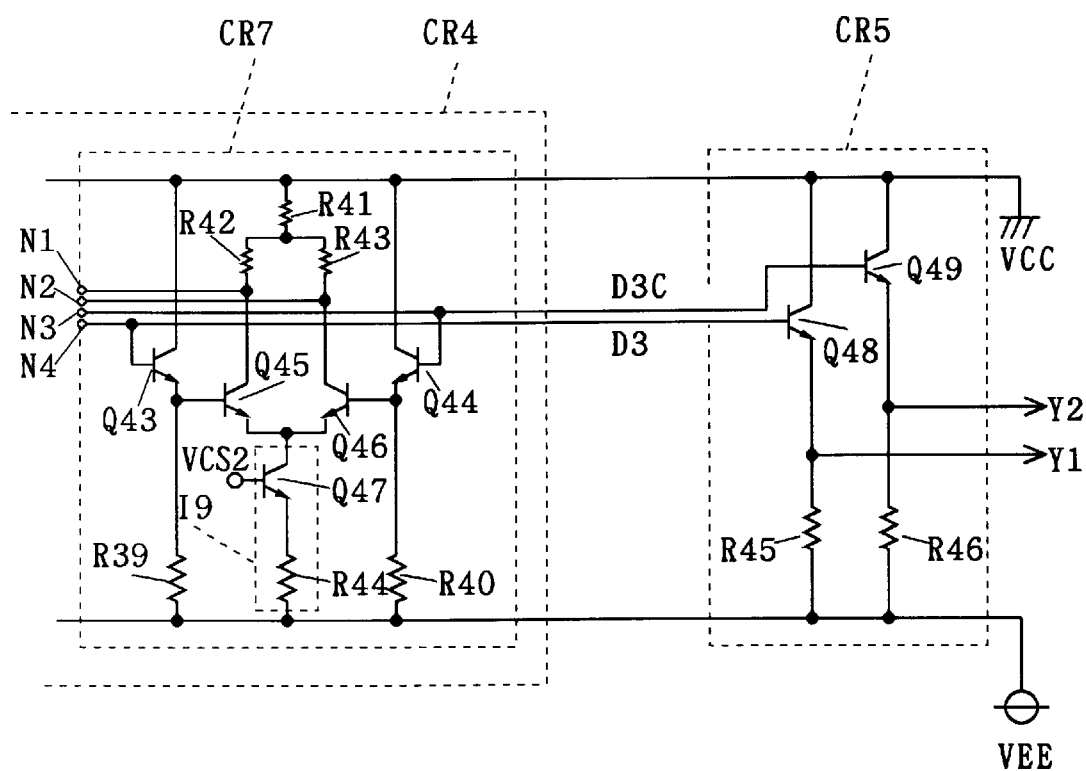
FIG. 2 is a circuit diagram showing the following stage of the structure of the flip-flop circuit according to the first preferred embodiment of the present invention.
Figure 3:
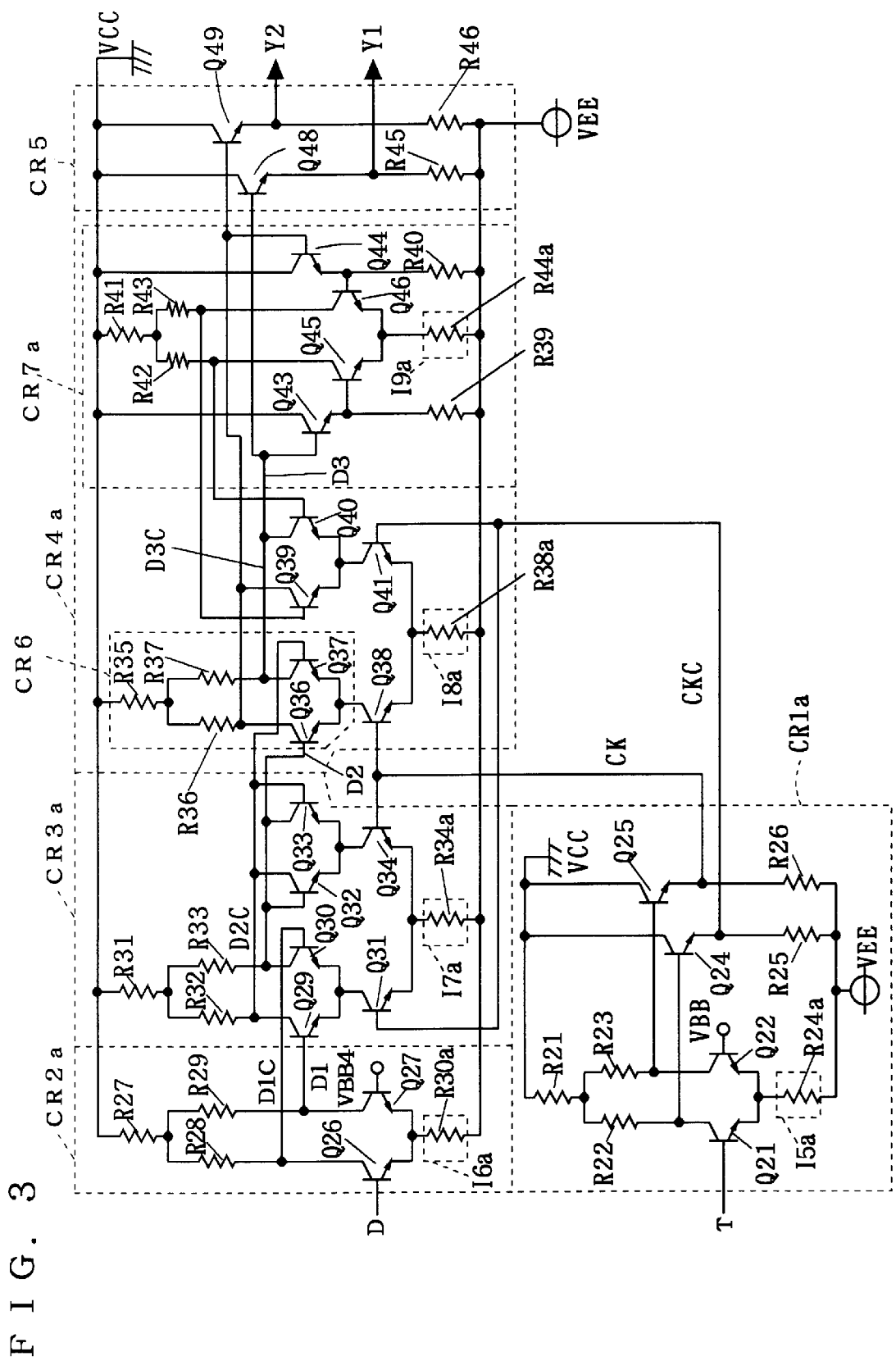
FIG. 3 is a circuit diagram showing a second implementation of the structure of the flip-flop circuit according to the first preferred embodiment of the present invention.

As shown in FIG. 3, the constant-current sources I5a–I9a of the flip-flop circuit of the first preferred embodiment can be formed only of resistors. The circuits CR1a–CR4a, CR7a can be constituted by replacing the constant-current sources I5–I9 of the corresponding circuits CR1–CR4, CR7 of FIG. 1 with the constant-current sources I5a–I9a formed only of resistors. In this case, since it is not necessary, unlike in the constant-current sources I5–I9, to consider the base-emitter voltage of the transistors, the power-supply voltage can be set 1 VBE lower than in the flip-flop circuit shown in FIG. 1 and FIG. 2, for example. This facilitates designing to enable operation with a low power-supply voltage.

For example, a power-supply voltage (VCC-VEE) of 3.3 V is usually applied to a flip-flop circuit. When two transistors are connected in series between the power-supply voltages VCC and VEE, even the flip-flop circuit shown in FIG. 3 requires, to simultaneously turn on the transistors, a voltage larger than twice the base-emitter junction forward voltage VBE required to turn on one transistor. For example, since a base-emitter forward voltage of 0.8 V is usually used for a transistor in a flip-flop circuit operating at a power-supply voltage of 3.3 V, it is desirable in order to take full advantage of the effects of the present invention that the power-supply voltage is smaller than 4.5 times the base-emitter forward voltage. It is desirable that an amplitude of the output signal is 0.4 V or larger to remove the influences of noise and signal attenuation, and it is further desirable that it is 0.5 V or larger.

Figure 4:
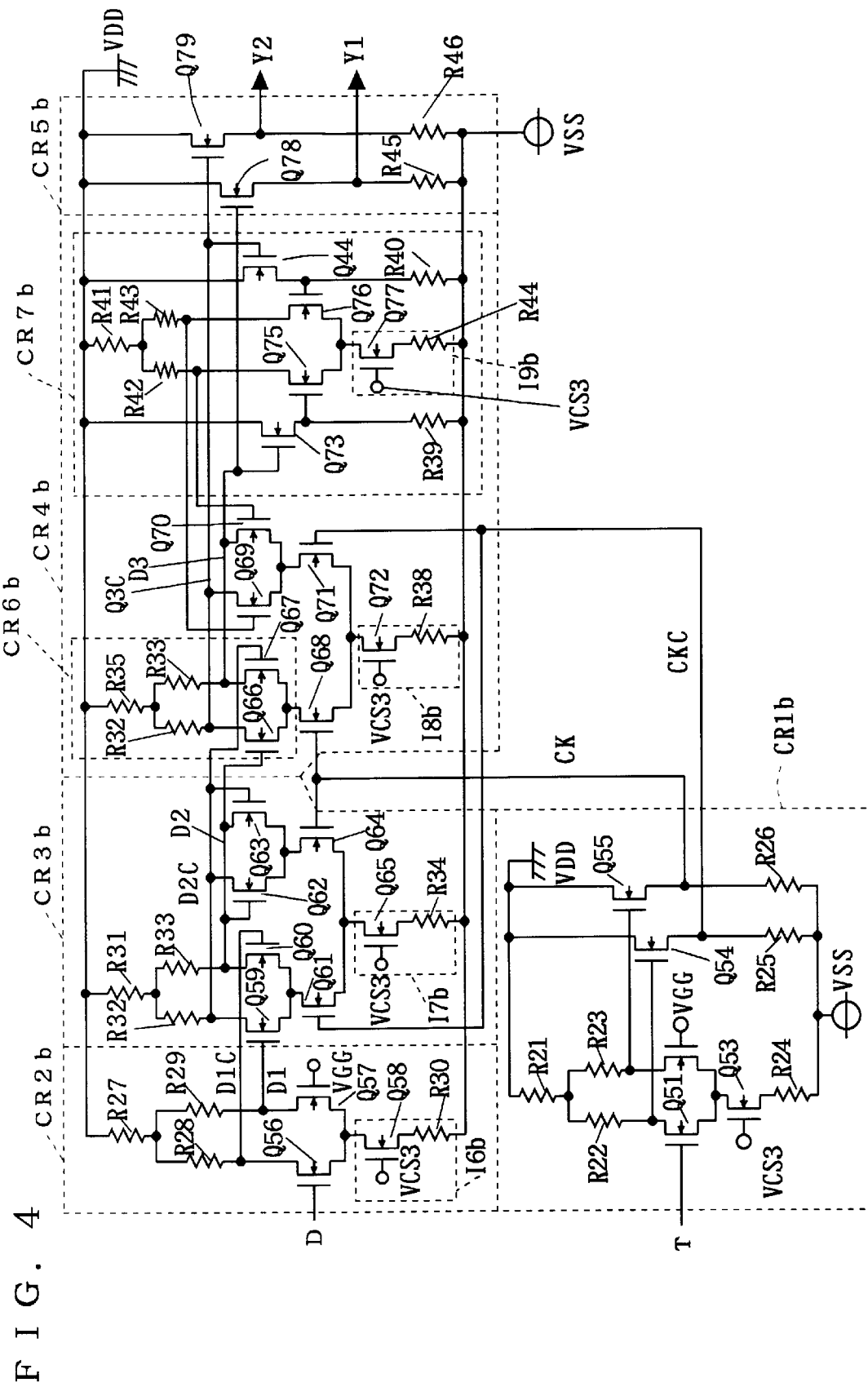
FIG. 4 is a circuit diagram showing a third implementation of the structure of the flip-flop circuit according to the first preferred embodiment of the present invention.

As shown in FIG. 4, the transistors in the flip-flop circuit of the first preferred embodiment may be replaced by MOS transistors. Although the circuits CR1b–7b in FIG. 4 are formed of different transistors from those in the circuits CR1–CR7 of FIG. 1, the connections in and between the circuits are the same. That is to say, the MOS transistors Q51–Q79 of FIG. 4 are connected to one another and to resistors R21–R46 and the constant-current sources I5b–I9b in the same way as the corresponding transistors Q21–Q49. Integrated circuits are often formed only of MOS transistors without using bipolar transistors. In this case, it is advantageous to use a flip-flop circuit formed only of MOS transistors which can be manufactured in the same process steps.

Second Preferred Embodiment

Figure 5:
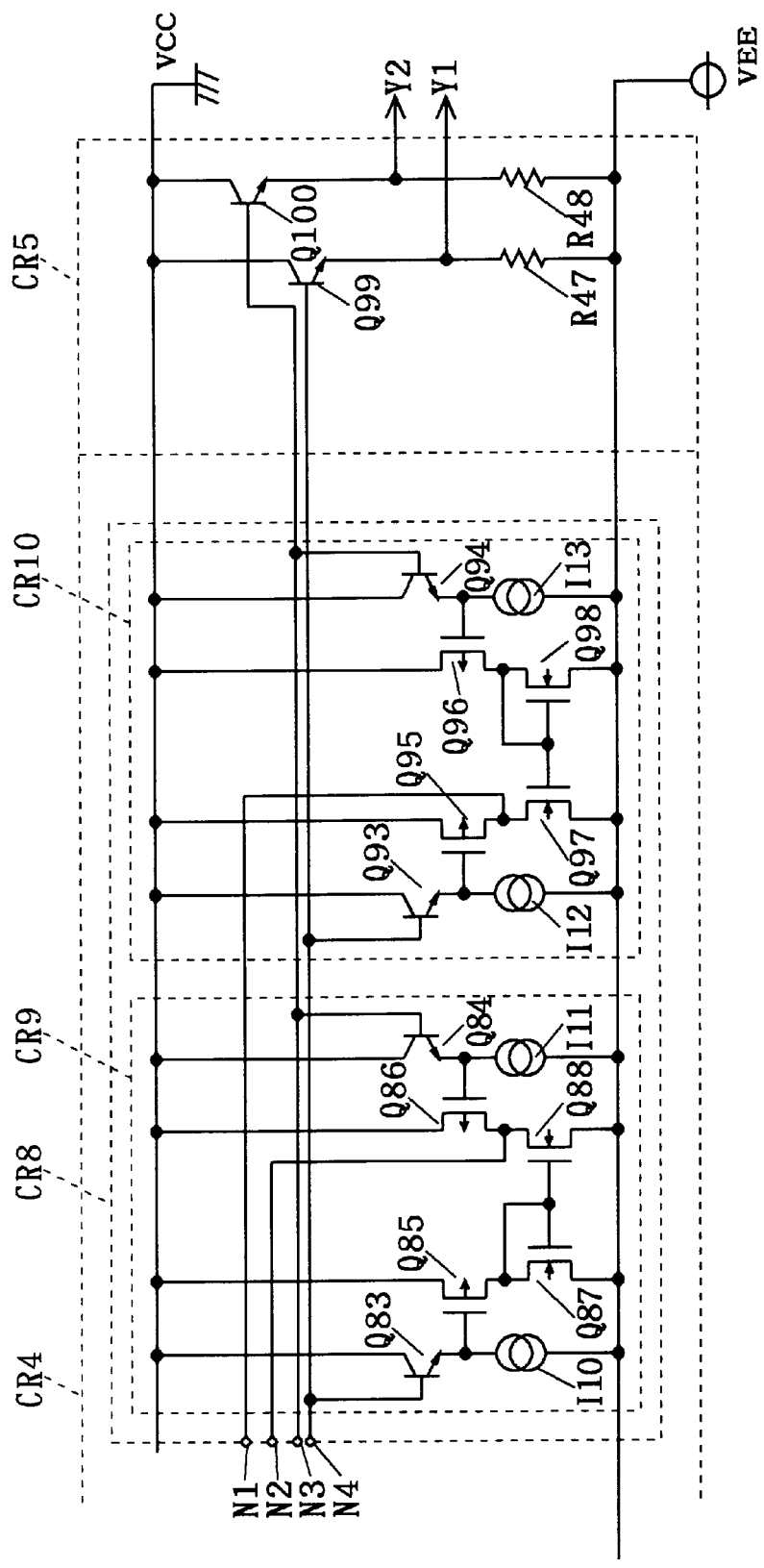
FIG. 5 is a circuit diagram showing the following stage of a structure of a flip-flop circuit according to a second preferred embodiment of the present invention.

A flip-flop circuit according to a second preferred embodiment of the present invention will be explained referring to FIG. 1 and FIG. 5. FIG. 1 and FIG. 5 are circuit diagrams showing the structure of a flip-flop circuit according to a second preferred embodiment of the present invention.

FIG. 5 shows the circuit structure of an internal level converting circuit of the slave latch and an output circuit.

Since the difference between the flip-flop circuit of the first preferred embodiment and the flip-flop circuit of the second preferred embodiment resides in the structure of the internal level converting circuit, the structure of the internal level converting circuit of the second preferred embodiment will be explained.

As shown in FIG. 5, the internal level converting circuit CR8 of the second preferred embodiment is connected to the preceding stage through the output terminals N1 and N2 and the input terminals N3 and N4. The internal level converting circuit CR8 is formed of symmetrical two level converting portions CR9 and CR10.

The level converting portion CR9 is formed of NPN bipolar transistors Q83, Q84, P-channel MOS transistors Q85, Q86, N-channel MOS transistors Q87, Q88, and constant-current sources I10, I11. The transistors Q83 and Q84 have emitters, bases connected respectively to the input terminals N4 and N3, and collectors to which the power-supply voltage VCC is applied. The constant-current source I10 makes a certain current flow out through the emitter of the transistor Q83 and the constant-current source I11 makes a certain current flow out through the emitter of the transistor Q84.

The transistors Q85 and Q86 have drains, sources to which the power-supply voltage VCC is applied, and gates connected to the emitters of the transistors Q83 and Q84. The drain of the transistor Q86 is connected to the output terminal N2. The transistors Q87 and Q88 have sources provided with the power-supply voltage VEE, gates connected to each other, and drains connected to the drains of the transistors Q85 and Q86. The drain of the transistor Q87 is connected to its gate to form an active load.

The signal converted in the level converting portion CR9 is outputted from the drain of the transistor Q86 to the output terminal N2. At this time, it is possible to easily set the upper limit of the high level, since outputted from the drain of the transistor Q86 is a voltage lower than the power-supply voltage VCC by the threshold voltage VTHp of the transistor Q86.

This also applies to the level converting portion CR10. The level converting portion CR10 is formed of NPN bipolar transistors Q93, Q94 corresponding to the transistors Q83 and Q84 of the level converting portion CR9, constant-current sources I12, I13 corresponding to the constant-current sources I10, I11, P-channel MOS transistors Q95, Q96 corresponding to the transistors Q85, Q86 of the level converting portion CR9, and N-channel MOS transistors Q97, Q98 corresponding to the transistors Q87, Q88 of the level converting portion CR9. The connections between the elements are the same in the level converting portions CR9 and CR10 except that the drain of the transistor Q98 is connected to its gate and that the drain of the transistor Q97 is connected to the output terminal N1.

Third Preferred Embodiment

Figure 6:
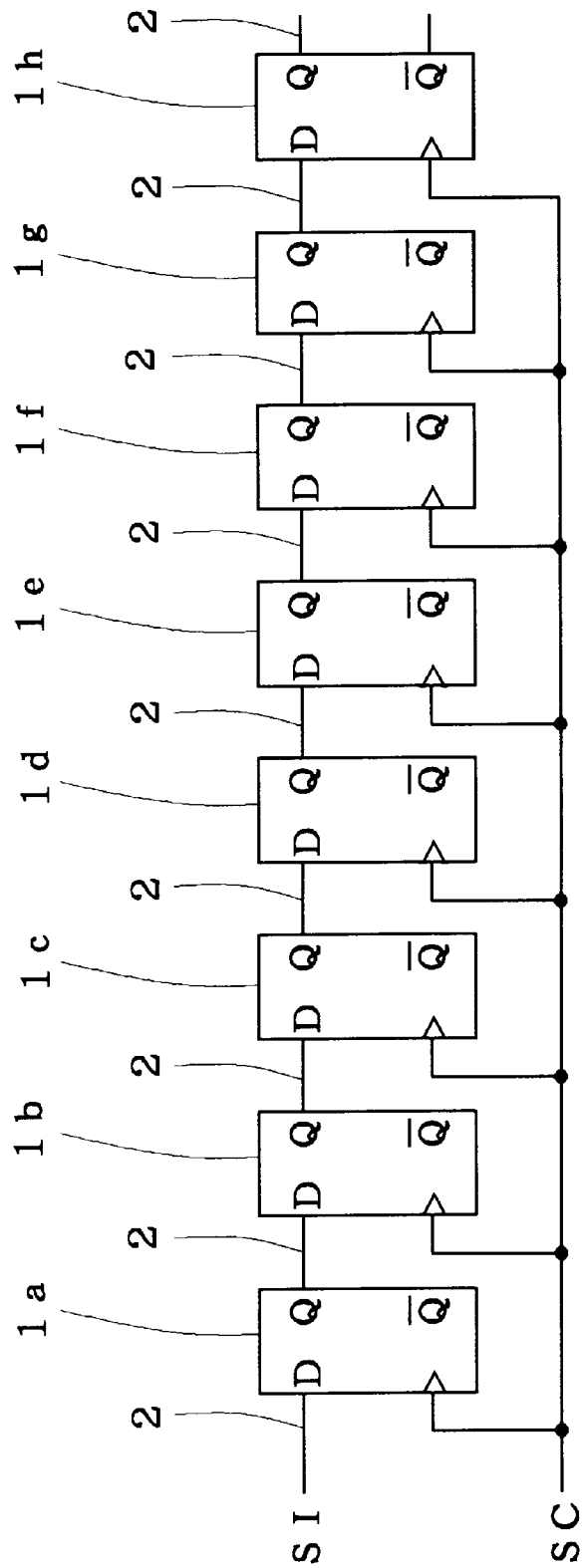
FIG. 6 is a block diagram showing an example of structure of a shift register circuit according to a third preferred embodiment of the present invention.

Next, a shift register circuit according to a third preferred embodiment of the present invention will be explained referring to FIG. 6. In FIG. 6, 1a–1h denote flip-flop circuits having the same structure as the flip-flop circuit of the first preferred embodiment and 2 denotes interconnections transferring input/output signals of the flip-flop circuits 1a–1h. The flip-flop circuits 1a–1h operate with the same clock SC. The flip-flip circuits 1b–1h each receive an output Q from their respective preceding flip-flip circuits 1a–1g as an input signal D. Since the signal SI inputted to the flip-flop circuit 1a is outputted through the eight flip—flip circuits 1a–1h, an output signal SO is delayed from the input signal for eight clocks.

When the shift register circuit shown in FIG. 6 is designed on cell base by using auto placement and routing, for example, the structure of a flip-flop circuit is defined as a macro cell and the positions of the flip-flop circuits 1a–1h and the positions and lengths of the interconnections 2 connecting them are automatically determined. Accordingly, the freedom in the auto placement and routing increases as the permissible ranges for the lengths of the interconnections 2 and the corresponding signal attenuation are larger, which enables the auto placement and routing to be applied to a larger area at higher speed. Since the signal amplitude of the outputs from the flip-flop circuits 1a–1h can be set as large as 0.5 V even with a power-supply voltage of 3.3 V, for example, the lengths of the interconnections 2 and the signal attenuation on the interconnections 2 have large permissible ranges. The delay times of each of the flip-flop circuits 1a–1h for the clocks SC, SI are not larger than conventional ones and the speed of the shift register is therefore not slower.

Fourth Preferred Embodiment

Figure 7:
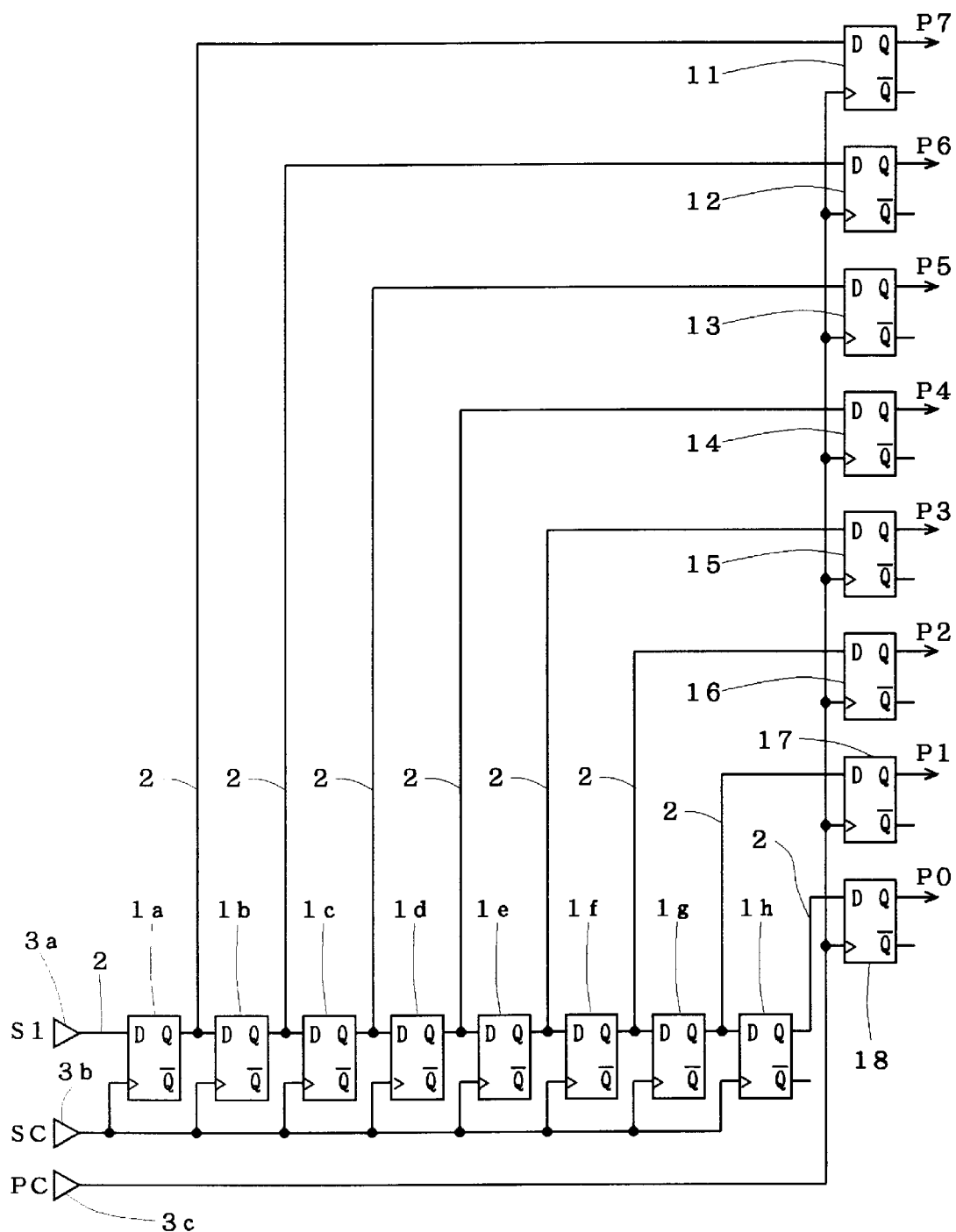
FIG. 7 is a block diagram showing an example of structure of a serial-parallel converting circuit according to a fourth preferred embodiment of the present invention.

Next, a serial-parallel converting circuit according to a fourth preferred embodiment of the present invention will be explained referring to FIG. 7. FIG. 7 is a block diagram showing an example of structure of a serial-parallel converting circuit for outputting serial-inputted 8-bit data in parallel. In FIG. 7, 1a–1h, 11–18 denote flip-flop circuits each having the same structure as that shown in the first preferred embodiment, 2 denotes interconnections for transferring signals of the flip-flop circuits 1a–1h, 3a–3c denote buffers for making constant the output load impedances of the clocks SC, PC and the input data SI received at the flip-flop circuits, so as to reduce the influences.

The flip-flop circuits 1a–1h are connected in series, like those in the second preferred embodiment. The flip-flop circuits 1a–1h are provided with the clock SC through the buffer 3b. The flip—flip circuits 11–18 are provided with the clock PC through the buffer 3c. The flip-flop circuits 11–18 receive the outputs from the flip-flop circuits 1a–1h as data inputs D, respectively. The data are inputted in series to the flip-flop circuits 1a–1h in order according to the clock SC. With the flip-flop circuits 1h–1a provided with 8-bit data in series, the clock PC causes the flip-flop circuits 11–18 to receive the output data from the flip-flop circuits 1a–1h as inputs at the same time. Then the flip-flop circuits 11–18 output the 8-bit data in parallel as outputs P7–P0 according to the clock PC.

The use of the flip-flop circuit shown in the first preferred embodiment in this serial-parallel converting circuit allows the interconnections 2 to be designed more freely than conventional ones and allows the auto placement and routing to be performed more easily. In each of the flip-flop circuits 1a–1h and 11–18, the delay times for the clocks SC, SI, PC are not increased as compared with conventional ones and the serial-parallel converting circuit holds the same processing speed as conventional ones.

Fifth Preferred Embodiment

Figure 8:
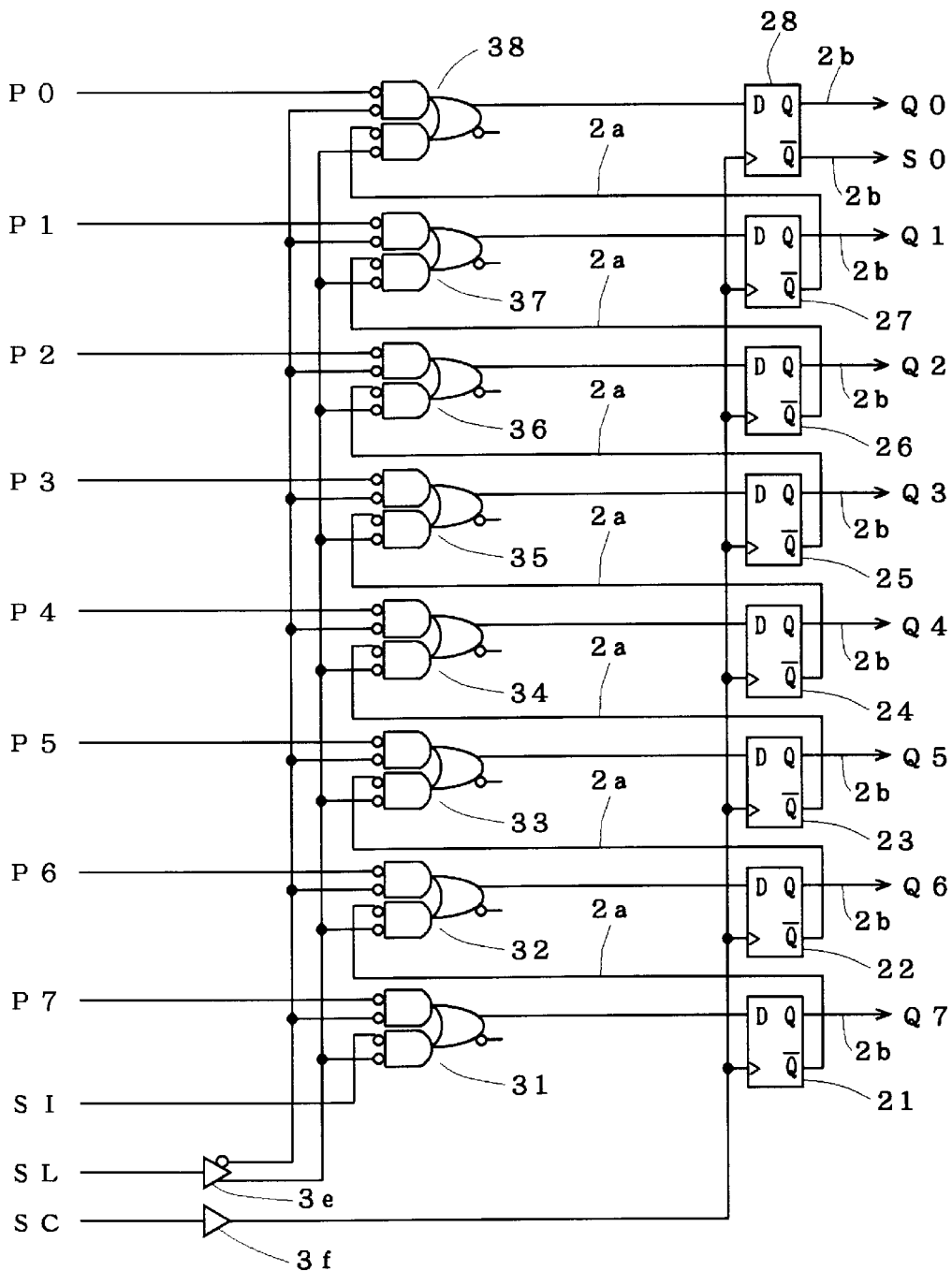
FIG. 8 is a block diagram showing an example of structure of a parallel-serial converting circuit according to a fifth preferred embodiment of the present invention.

Next, a parallel-serial converting circuit according to a fifth preferred embodiment of the present invention will be described referring to FIG. 8. FIG. 8 is a block diagram showing an example of structure of a parallel-serial converting circuit for outputting parallel-inputted 8-bit data in series. In FIG. 8, 21–28 denote flip-flop circuits shown in the first preferred embodiment, 31–38 denote AND-OR gates for NOT-ORing first and second inputs to obtain an output A and NOT-ORing third and fourth inputs to obtain an output B, and outputting OR (A+B) of the output A and the output B, 2a denotes interconnections between the flip-flop circuits 21–27 and the AND-OR gates 32–38, 2b denotes interconnections for outputs of the flip-flop circuits 21–28, and 3e, 3f denote buffers for making constant the output load impedances of the clock SC received at the flip-flop circuits 21–28 and the selection signal SL received at the AND-OR gates 31–38 to reduce the influences.

The AND-OR gates 31–38 are each supplied with a signal having the logic value inverse to that of the selection signal SL at the second input through the buffer 3e and are each supplied with the selection signal SL at the fourth input in common through the buffer 3e. The third inputs of the AND-OR gates 31–38 are each supplied with the data SI and the inverse outputs $\overline{Q}$ of the flip-flop circuits 21–27. Inputted to the first inputs of the AND-OR gates 31–38 are the 8-bit data P7–P0 inputted in parallel. Provided to the data inputs D of the flip-flop circuits 21–28 are the outputs from the AND-OR gates 31–38. With this circuit structure, it is possible to select with the selection signal SL whether to output the parallel-inputted data in parallel as they are, or to output the data in series. When performing parallel-serial conversion, the selection signal SL is forced to a low-potential side and then the outputs of the AND-OR gates 32–38 receiving the outputs from the flip-flop circuits 21–27 are determined according to the inverse outputs $\overline{Q}$ of the flip-flop circuits 21–27.

In this parallel-serial converting circuit, as well as in the second preferred embodiment, the use of the flip-flop circuit of the first preferred embodiment allows the interconnections 2a or the interconnections 2b to be designed more freely than conventional ones and allows the auto placement and routing to be performed easily. The delay times for the clocks SC, SI, SL are not increased as compared with conventional ones in each of the flip-flop circuits 1a–1h and 11–18 and the parallel-serial converting circuit keeps the same processing speed as the conventional ones.

Sixth Preferred Embodiment

Figure 9:
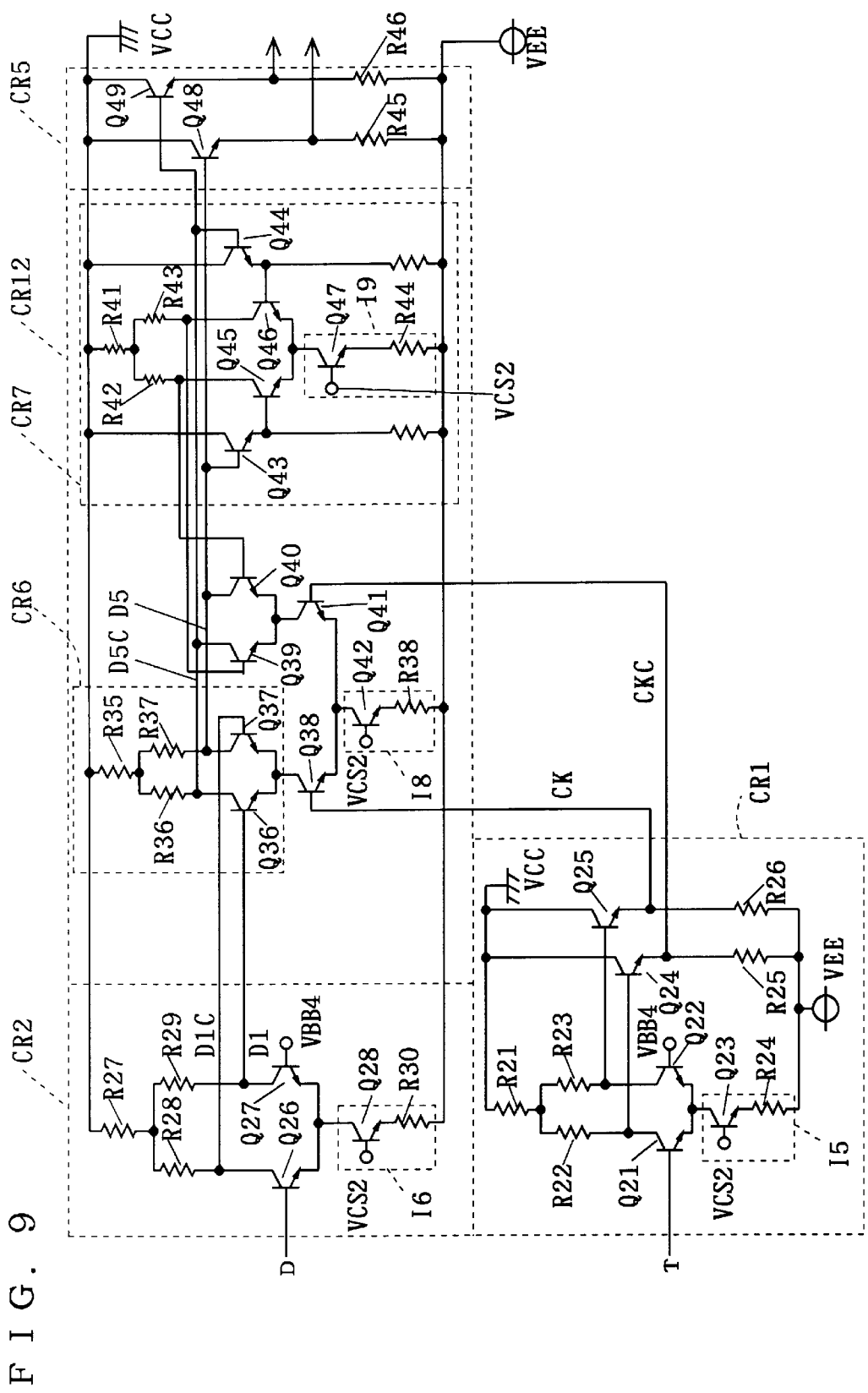
FIG. 9 is a circuit diagram showing a structure of a latch circuit according to a sixth preferred embodiment of the present invention.

Next, a latch circuit according to a sixth preferred embodiment of the present invention will be described referring to FIG. 9. FIG. 9 is a circuit diagram showing the structure of a data latch of a sixth preferred embodiment of the present invention. In FIG. 9, the same reference characters as those in FIG. 1 and FIG. 2 show the corresponding parts. The latch circuit CR12 corresponding to the slave latch CR4 of the flip-flop circuit of the first preferred embodiment has entirely the same structure as the slave latch CR4.

In the structure of this data latch, the master latch CR3 is removed from the flip-flop circuit of the first preferred embodiment. That is to say, the output signals D1, D1C of the input level converting circuit CR2 are directly inputted to the differential amplification portion CR6 of the latch portion CR12.

In this data latch circuit, when the input signal D swings between –0.85 V and –1.35 V, for example, the input level converting circuit CR2 outputs signals D1, D1C which swing between –0.25 V and –0.55 V.

When the power-supply voltage VCC is 0 V and the power-supply voltage VEE is –3.3 V, it is possible to set the output signals D5, D5C of the latch portion CR12 to swing between –0.05 V and –0.55 V. This is enabled by setting a low upper limit on the high level side of the voltage of the signals fed back to the bases of the transistors Q39 and Q40 with the internal level converting circuit CR7.

That is to say, if the collector of the transistor Q39 is –0.55 V and the collector of the transistor Q40 is –0.05 V, for example, and these voltages are intactly fed back to the bases of the transistors Q39 and Q40 in a conventional manner, the voltage at the collector of the transistor Q39 becomes –0.45 V lower than that at the base thereof and then a current flows from the base to the collector of the transistor Q39 in an off state, which will slow down the operating speed. Hence, the high level of the signals fed back to the bases of the transistors Q39 and Q40 is limited, e.g., it is limited to –0.25 V in this case, which prevents a current flowing from the base to the collector of one of the transistors Q39 and Q40 in an off state, enabling circuit operation at high speed. Thus preventing a current flowing from the base to the collector with this structure reduces the possibility of malfunction as compared with the case in which a current flows from the base to the collector.

Figure 10:
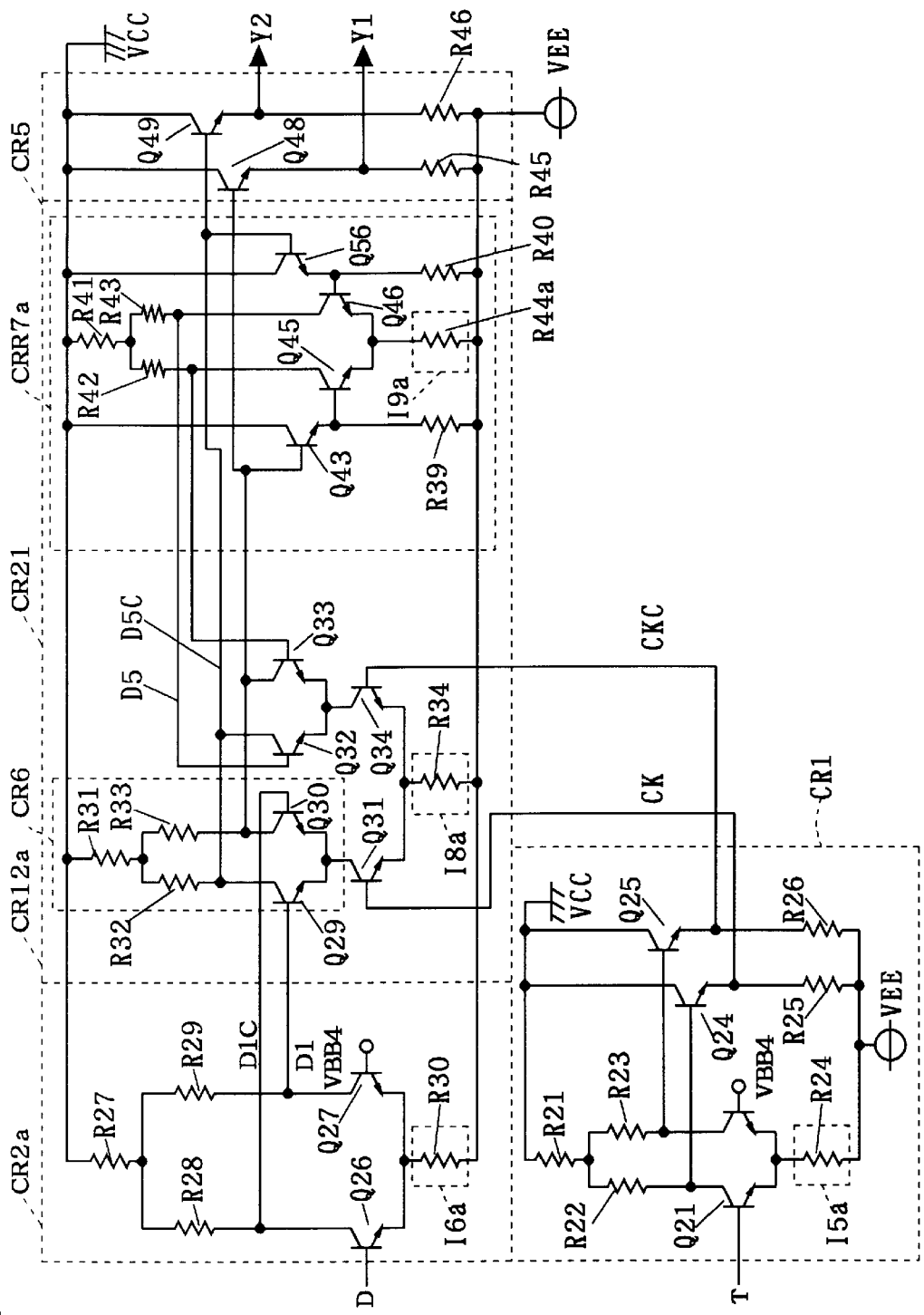
FIG. 10 is a circuit diagram showing the structure of a second implementation of the latch circuit according to the sixth preferred embodiment of the present invention.

As shown in FIG. 10, as well as the first preferred embodiment, the constant-current sources I5a–I9a of the latch circuit of the sixth preferred embodiment can be formed only of resistors, providing the same effects as the flip-flop circuit shown in FIG. 3.

Figure 11:
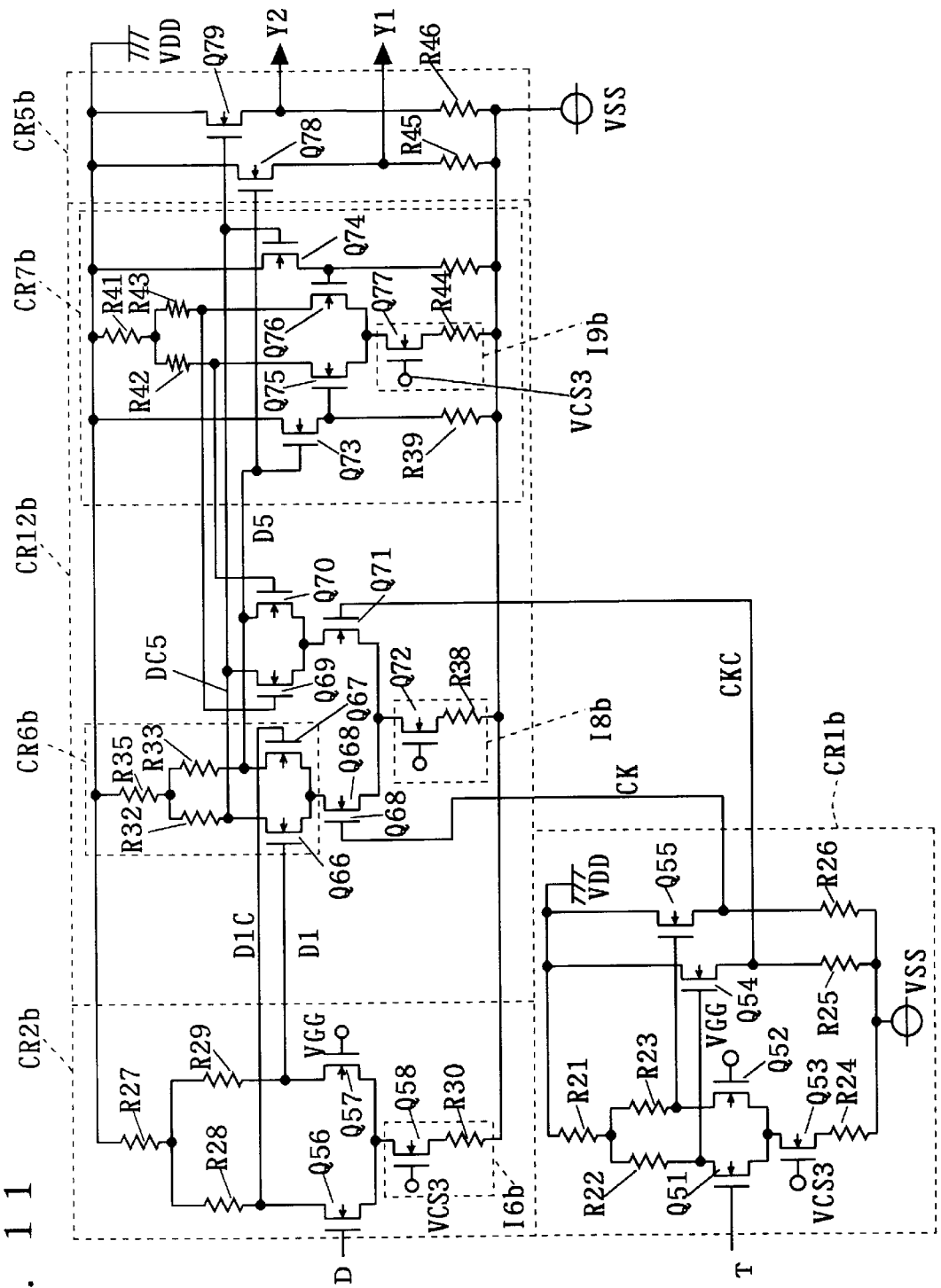
FIG. 11 is a circuit diagram showing the structure of a third implementation of the latch circuit according to the sixth preferred embodiment of the present invention.

As shown in FIG. 11, as well as the first preferred embodiment, the transistors in the latch circuit of the sixth preferred embodiment can be replaced by MOS transistors, providing the same effects as the flip-flop circuit shown in FIG. 4.

Although the first and fifth preferred embodiments have shown specific examples of the internal level converting circuits CR7, CR7a, CR7b, the internal level converting circuits may be constituted in other ways. Those capable of limiting the upper limit of the high level will provide the same effects as the above-described preferred embodiments.

While the invention has been described in detail, the foregoing description is in all aspects illustrative and not restrictive. It is understood that numerous other modifications and variations can be devised without departing from the scope of the invention.

I claim:

1. A flip-flop circuit, comprising:

a master latch having first and second output terminals for outputting held data as a potential difference between said first and second output terminals, for holding, as data, a value of an input signal at the time when a clock goes to a first level while said clock remains at said first level; and a slave latch for holding output data of said master latch when said clock goes to a second level;

wherein said slave latch comprises, differential amplification means having first and second input terminals for differential-amplifying a potential difference between said first and second output terminals of said master latch to output first and second output signals from first and second output terminals, respectively, level converting means connected to said first and second output terminals of said differential amplification means, for reducing an amplitude of said output signals of said differential amplification means to output first and second output signals from first and second output terminals of said level converting means, respectively, a first transistor having one current electrode, another current electrode connected to said first output terminals of said differential amplification means, and a control electrode connected to said first output terminal of said level converting means, a second transistor having one current electrode connected to said one current electrode of said first transistor, another current electrode connected to said second output terminal of said differential amplification means, and a control electrode connected to said second output terminal of said level converting means, a third transistor having one current electrode, another current electrode and a control electrode, for controlling a power-supply current to be supplied to said differential amplification means according to said clock provided to said control electrode, a fourth transistor having one current electrode connected to said one current electrode of said third transistor, another current electrode connected to said one current electrode of said first transistor and to said one current electrode of said second transistor, and a control electrode supplied with an inverse clock of said clock provided to said control electrode of said third transistor, and a first constant-current source for making constant current flow out through said one current electrode of said third transistor and said one current electrode of said fourth transistor, wherein said level converting means comprises, first resistance means having one end to which a power-supply voltage is applied and another end, second resistance means having one end connected to said another end of said first resistance means and another end connected to said first output terminal of said level converting means, third resistance means having one end connected to said another end of said first resistance means and another end connected to said second output terminal of said level converting means, a fifth transistor having one current electrode, another current electrode to which said power-supply voltage is applied and a control electrode connected to said second output terminal of said differential amplification means, a sixth transistor having one current electrode another current electrode to which said power-supply voltage is applied and a control electrode connected to said first output terminal of said differential amplification means, a seventh transistor having one current electrode, another current electrode connected to said another end of said second resistance means, and a control electrode connected to said one current electrode of said fifth transistor, an eighth transistor having one current electrode connected to said one current electrode of said seventh transistor, another current electrode connected to said another end of said third resistance means, and a control electrode connected to the one current electrode of said sixth transistor, a second constant-current source connected to said one current electrode of said seventh transistor and said one current electrode of said eighth transistor for keeping a current flowing in a connection point of said one current electrode of said seventh transistor and said one current electrode of said eighth transistor constant, a third constant-current source connected to said one current electrode of said fifth transistor for keeping a current flowing in said one current electrode of said fifth transistor constant and a fourth constant-current source connected to said one current electrode of said sixth transistor for keeping a current flowing in said one current electrode of said sixth transistor constant.

2. The flip-flop circuit according to claim 1, which outputs a voltage of not less than 0.4 V between said first and second output terminals of said differential amplification means when said power supply voltage applied to said flip-flop circuit is larger than twice and smaller than 4.5 times a forward voltage between said control electrode and said one current electrode of each of said first to fourth transistors.

3. The flip-flop circuit according to claim 1, wherein said differential amplification means comprises:

fourth resistance means having one end to which said power-supply voltage is applied and another end, fifth resistance means having one end connected to said another end of said fourth resistance means and another end, sixth resistance means having one end connected to said another end of said fourth resistance means and another end, a ninth transistor having one current electrode connected to said another current electrode of said third transistor, another current electrode connected to said another end of said fifth resistance means, and a control electrode connected to said first output terminal of said master latch, and a tenth transistor having one current electrode connected to said one current electrode of said ninth transistor, another current electrode connected to said another end of said sixth resistance means, and a control electrode connected to said second output terminal of said master latch, wherein said another current electrode of said tenth transistor corresponds to said first output terminal of said differential amplification means and said another current electrode of said ninth transistor corresponds to said second output terminal of said differential amplification means.

4. A parallel-serial converting circuit formed by using a plurality of flip-flop circuits in a semiconductor integrated circuit, wherein each of said plurality of flip-flop circuits comprises, a master latch having first and second output terminals for outputting held data as a potential difference between said first and second output terminals, for holding, as data, a value of an input signal at the time when a clock goes to a first level while the clock remains at said first level; and a slave latch for holding output data of said master latch when said clock goes to a second level;

wherein said slave latch comprises, differential amplification means having first and second input terminals for differential-amplifying a potential difference between said first and second output terminals of said master latch to output first and second output signals from first and second output terminals, respectively, level converting means connected to said first and second output terminals of said differential amplification means, for reducing an amplitude of said output signals of said differential amplification means to output first and second output signals from first and second output terminals of said level converting means respectively, a first transistor having one current electrode, another current electrode connected to said first output terminal of said differential amplification means, and a control electrode connected to said first output terminal of said level converting means,
a second transistor having one current electrode connected to said one current electrode of said first transistor, another current electrode connected to said second output terminal of said differential amplification means, and a control electrode connected to said second output terminal of said level converting means,
a third transistor having one current electrode, another current electrode connected to said differential amplification means, and a control electrode supplied with said clock, for controlling a power-supply current to be supplied to said differential amplification means according to said clock,
a fourth transistor having one current electrode connected to said one current electrode of said third transistor, another current electrode connected to said one current electrode of said first transistor and to said one current electrode of said second transistor, and a control electrode supplied with an inverse clock of said clock provided to said control electrode of said third transistor, and
a first constant-current source for making constant current flow out through said one current electrode of said third transistor and said one current electrode of said fourth transistor,
wherein said level converting means comprises,
first resistance means having one end to which a power-supply voltage is applied and another end,
second resistance means having one end connected to said another end of said first resistance means and another end connected to said first output terminal of said level converting means,
third resistance means having one end connected to said another end of said first resistance means and said another end connected to said second output terminal of said level converting means,
a fifth transistor having one current electrode said another current electrode to which said power-supply voltage is applied, and a control electrode connected to said second output terminal of said differential amplification means,
a sixth transistor having one current electrode, another current electrode to which said power-supply voltage is applied, and a control electrode connected to said first output terminal of said differential amplification means,
a seventh transistor having one current electrode, another current electrode connected to said another end of said second resistance means, and a control electrode connected to said one current electrode of said fifth transistor,
an eighth transistor having one current electrode connected to said one current electrode of said seventh transistor, another current electrode connected to said another end of said third resistance means, and a control electrode connected to said one current electrode of said sixth transistor,
a second constant-current source connected to said one current electrode of said seventh transistor and said one current electrode of said eighth transistor, for keeping constant a current flowing in a connection point of said one current electrode of said seventh transistor and said one current electrode of said eighth transistor constant,
a third constant-current source connected to said one current electrode of said fifth transistor, for keeping a current flowing in said one current electrode of said fifth transistor constant, and
a fourth constant-current source connected to said one current electrode of said sixth transistor, for keeping a current flowing in said one current electrode of said sixth transistor constant.

5. The parallel-serial converting circuit according to claim 4, wherein each of said flip-flop circuits outputs a voltage of not less than 0.4 V between said first and second output terminals of said differential amplification means when said power supply voltage applied to each said flip-flop circuit larger than twice and smaller than 4.5 times a forward voltage between said control electrode and one current electrode of each of said first to fourth transistors.

6. A latch circuit, comprising:
differential amplification means for differential-amplifying a potential difference between first and second input signals signals to output first and second output signals from first and second output terminals respectively;
level converting means connected to said first and second output terminals of said differential amplification means, for reducing an amplitude of said first and second output signals of said differential amplification means to output first and second output signals from first and second output terminals of said level converting means, respectively;
a first transistor having one current electrode, another current electrode connected to said first output terminal of said differential amplification means, and a control electrode connected to said first output terminal of said level converting means,
a second transistor having one current electrode connected to said one current electrode of said first transistor, another current electrode connected to said second output terminal of said differential amplification means, and a control electrode connected to said second output terminal of said level converting means,
a third transistor for controlling a power-supply current to be supplied to said differential amplification means according to a clock provided to a control electrode,
a fourth transistor having one current electrode connected to said one current electrode of said third transistor, another current electrode connected to said one current electrode of said first transistor and to said one current electrode of said second transistor, and a control electrode supplied with an inverse clock of said clock provided to said control electrode of said third transistor, and
a first constant-current source for making constant current flow out through said one current electrode of said third transistor and said one current electrode of said fourth transistor,
wherein said level converting means comprises,
first resistance means having one end to which a power-supply voltage is applied and another end,
second resistance means having one end connected to said another end of said first resistance means and another end connected to said first output terminal of said level converting means,
third resistance means having one end connected to said another end of said first resistance means and another end connected to said second output terminal of said level converting means,
a fifth transistor having one current electrode, another current electrode to which said power-supply voltage is applied, and a control electrode connected to said second output terminal of said differential amplification means, a sixth transistor having one current electrode, another current electrode to which said power-supply voltage is applied, and a control electrode connected to said first output terminal of said differential amplification means, a seventh transistor having one current electrode, another current electrode connected to said another end of said second resistance means, and a control electrode connected to said one current electrode of said fifth transistor, an eighth transistor having one current electrode connected to said one current electrode of said seventh transistor, another current electrode connected to said another end of said third resistance means, and a control electrode connected to said one current electrode of said sixth transistor, a second constant-current source connected to said one current electrode of said seventh transistor and said one current electrode of said eighth transistor, for keeping a current flowing in a connection point of said one current electrode of said seventh transistor, and said one current electrode of said eighth transistor constant, a third constant-current source connected to said one current electrode of said fifth transistor, for keeping a current flowing in said one current electrode constant, and a fourth constant-current source connected to said one current electrode of said sixth transistor, for keeping a current flowing in said one current electrode constant.

7. The latch circuit according to claim 6, wherein said differential amplification means comprises, fourth resistance means having one end to which said power-supply voltage is applied and another end, fifth resistance means having one end connected to said another end of said fourth resistance means and another end, sixth resistance means having one end connected to said another end of said fourth resistance means and another end, a ninth transistor having one current electrode connected to said another current electrode of said third transistor, another current electrode connected to said another end of said fifth resistance means, and a control electrode connected to said first input signal, and a tenth transistor having one current electrode connected to said one current electrode of said ninth transistor, another current electrode connected to said another end of said sixth resistance means, and a control electrode connected to said second input signal, wherein said another current electrode of said tenth transistor corresponds to said first output terminal of said differential amplification means and said another current electrode of said ninth transistor corresponds to said second output terminal of said differential amplification means.

8. The latch circuit according to claim 6, which outputs a voltage of not less than 0.4 V between said first and second output terminals of said differential amplification means when said power supply voltage applied to the latch circuit larger than twice and smaller than 4.5 times a forward voltage between said control electrode and one current electrode of each of said first to fourth transistors.

* * * * *